(12) United States Patent
Song et al.

(10) Patent No.: US 9,805,153 B2
(45) Date of Patent: *Oct. 31, 2017

(54) PLD EDITOR AND METHOD FOR EDITING PLD CODE

(71) Applicant: ROCKWELL AUTOMATION TECHNOLOGIES, INC., Mayfield Heights, OH (US)

(72) Inventors: Tao Song, Shanghai (CN); Zhen Wei, Shanghai (CN); Fabio Malaspina, Twinburg, OH (US); Hongrui Li, Menomonee Falls, WI (US); Zhiyan Chen, Shanghai (CN)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/828,116

(22) Filed: Aug. 17, 2015

(65) Prior Publication Data
US 2015/0355887 A1    Dec. 10, 2015

Related U.S. Application Data

(63) Continuation of application No. 14/051,617, filed on Oct. 11, 2013, now Pat. No. 9,112,493.

(51) Int. Cl.
*G06F 11/07* (2006.01)
*G06F 7/38* (2006.01)
*H03K 19/173* (2006.01)
*G06F 17/50* (2006.01)

(52) U.S. Cl.
CPC ....... *G06F 17/5054* (2013.01); *H03K 19/173* (2013.01)

(58) Field of Classification Search
CPC .......................... G06F 17/5054; H03K 19/173
USPC .............. 326/38; 713/2; 714/37, 48, 49, 100
See application file for complete search history.

(56) References Cited

U.S. PATENT DOCUMENTS 5,794,033 A * 8/1998 Aldebert ............. G06F 13/4256
326/39

* cited by examiner

*Primary Examiner* — Daniel D Chang

(57) ABSTRACT

Technology for editing PLD code to be programmed into a PLD are provided. The technology includes an interface, a storage system, and a processing system configured to obtain a PLD code, with the PLD code comprising one or more logic instruction blocks and corresponding block parameters for each logic instruction block, with the PLD code being intended for programming into the PLD, compare the one or more logic instruction blocks of the PLD code to a subset of the library of logic instruction blocks applicable to the PLD according to the library of PLD devices, determine inconsistent logic instruction blocks of the one or more logic instruction blocks, indicate the inconsistent logic instruction blocks, and correct the inconsistent logic instruction blocks using the subset of the library of logic instruction blocks.

20 Claims, 6 Drawing Sheets

PLD CODE 130

| OPERATIONAL ROUTINE | 131 |
|---|---|
| INSTRUCTION BLOCK 1 | 133 |
| BLOCK 1 PARAMETER 1 | 134 |
| BLOCK 1 PARAMETER 2 | 134 |
| BLOCK 1 PARAMETER 3 | 134 |
| INSTRUCTION BLOCK 2 | 133 |
| BLOCK 2 PARAMETER 1 | 134 |
| BLOCK 2 PARAMETER 2 | 134 |
| INSTRUCTION BLOCK 3 | 133 |
| BLOCK 3 PARAMETER 1 | 134 |
| BLOCK 3 PARAMETER 2 | 134 |
| BLOCK 3 PARAMETER 3 | 134 |
| BLOCK 3 PARAMETER 4 | 134 |
| BLOCK 3 PARAMETER 5 | 134 |

FIG. 2

PLD EDITOR AND METHOD FOR EDITING PLD CODE

RELATED APPLICATIONS

This application is a continuation of, and claims priority to, U.S. patent application Ser. No. 14/051,617, filed on Oct. 11, 2013, which will grant on Aug. 18, 2015, as U.S. Pat. No. 9,112,493, and which is incorporated by reference in its entirety.

TECHNICAL BACKGROUND

Programmable Logic Devices (PLDs) are used in a variety of control applications, such as controllers and/or drivers in industrial applications. PLDs are low-cost devices that can be programmed for specific control applications, such as for operating electric motors, for example. The ability to program PLDs makes them ideal for stand-alone applications.

Because of the widespread use and deployment of PLDs, there is a continuing need to improve the reliability and ease-of-use of such devices. One area for improvement is in programming, wherein it is needed for a user to be able to quickly and easily generate a complete set of programming code for a particular PLD. However, it is also important that the programming be correct and functional, without consuming an excess amount of design and programming time on the part of an engineer or other user.

A prior art approach to programming PLD devices is to re-use existing programming, wherein the existing programming may be modified and then used in a new application, wherein existing programs are commonly modified and then re-used in some fashion. However, this introduces a danger of improper or incomplete programming because of the differences between an original PLD and a newly-modified PLD, which may result in more lost time, rather than less time consumed in the programming of the PLD device. In addition, there is a danger that unneeded portions of the code may be retained, wherein the retained code occupies memory space and in some situations may result in improper behavior of the PLD or associated device.

OVERVIEW

In an embodiment, a PLD editor for editing PLD code to be programmed into a PLD is provided. The PLD editor includes an interface for communicating with the PLD, a storage system for storing the PLD code, a library of PLD devices, and a library of logic instruction blocks, and a processing system coupled to the interface and the storage system, with the processing system configured to obtain a PLD code, with the PLD code comprising one or more logic instruction blocks and corresponding block parameters for each logic instruction block, with the PLD code being intended for programming into the PLD, compare the one or more logic instruction blocks of the PLD code to a subset of the library of logic instruction blocks applicable to the PLD according to the library of PLD devices, determine inconsistent logic instruction blocks of the one or more logic instruction blocks, indicate the inconsistent logic instruction blocks, and correct the inconsistent logic instruction blocks using the subset of the library of logic instruction blocks.

This Overview is provided to introduce a selection of concepts in a simplified form that are further described below in the Technical Disclosure. It should be understood that this Overview is not intended to identify key features or essential features of the claimed subject matter, nor is it intended to be used to limit the scope of the claimed subject matter.

BRIEF DESCRIPTION OF THE DRAWINGS

FIG. 2 shows an exemplary PLD code.

DETAILED DESCRIPTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Figure 1:
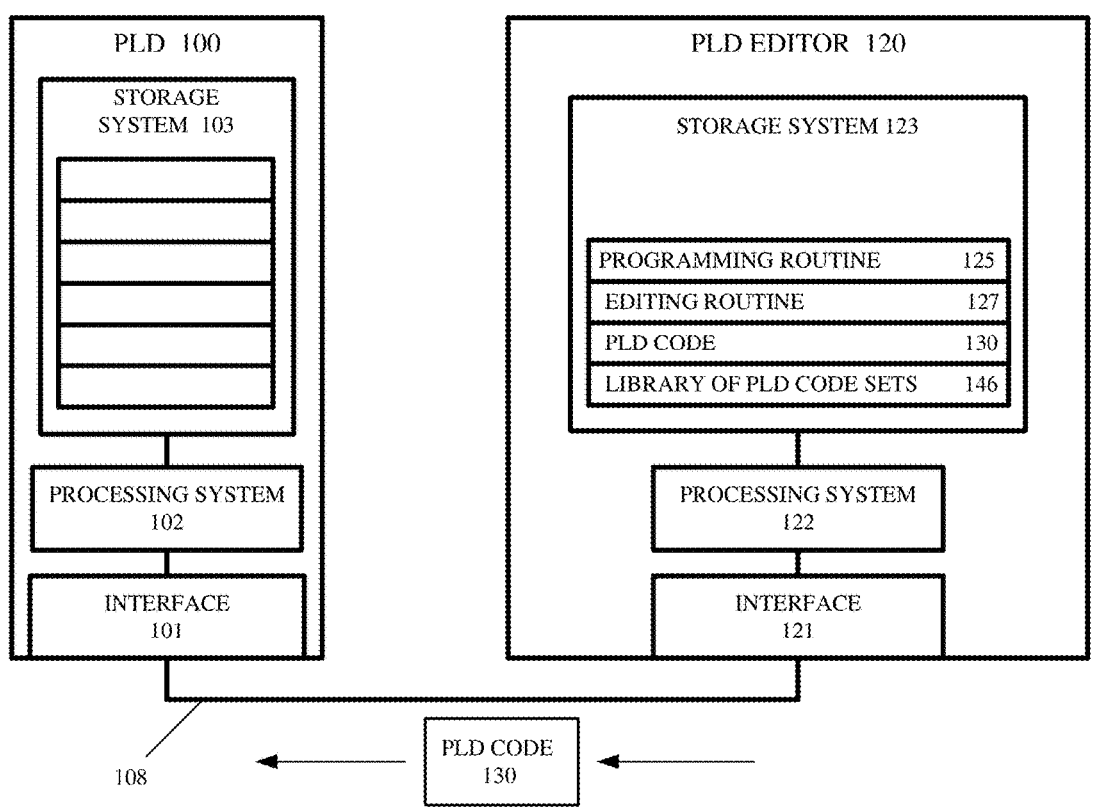
FIG. 1 illustrates a Programmable Logic Device (PLD) coupled to a PLD editor.

FIG. 1 illustrates a Programmable Logic Device (PLD) 100 coupled to a PLD editor 120. The PLD editor 120 may be used to generate portions of code or to generate an entire set of programming code. The PLD editor 120 may be used to select an existing set of programming code. The PLD editor 120 may be used to edit a selected PLD code 130 for programming into the PLD 100. The PLD editor 120 may be used to program the PLD code 130 into the PLD 100. The PLD code 130 may be programmed into volatile or non-volatile memory space in the storage system 103 of the PLD 100.

The PLD editor 120 may be coupled to the PLD 100 by a communication link 108, as shown in the figure. The communication link 108 may comprise any manner of communication link, including wired and wireless communication links. The communication link 108 may be used to transfer the PLD code 130 from the PLD editor 120 to the PLD 100. The communication link 108 may be a temporary or permanent link.

The PLD 100 may comprise any PLD device. The PLD 100 includes an interface 101, a processing system 102, and a storage system 103. The storage system 103 may receive and store the PLD code 130. The storage system 103 may also store a programming routine 125, an editing routine 127, and a library of PLD code sets 146. In operation, the processing system 102 of the PLD 100 may retrieve and execute the PLD code 130. The processing system 102 of the PLD 100, when executing the PLD code 130, may be configured to perform any desired PLD operations, including receiving and processing inputs, communicating with an external device (not shown), operating and/or controlling the external device, providing data to the external device, processing data from the external device, monitoring operations of the external device, including monitoring for faults or improper operation of the external device, and accumulating data regarding the operation of the external device. This listing is not exhaustive and other operations of the PLD 100 are contemplated and are within the scope of the description and claims.

The PLD code 130 may use predefined functions. The PLD code 130 may be represented by standardized symbols or other representations. As a result, a user may be able to select and implement these predefined functions, wherein the programming may be completed by the user providing needed parameters to complete the selected functions.

The PLD 100 may be configured to operate and/or drive an electric motor, for example, as PLD devices are widely used in motion control, positioning control, and torque control. In one motor control example, the programming of the PLD code 130 may include timers that control various aspects of motor operation, including a drive signal pulse width, a drive signal duty cycle, and drive signal on and off times, among other things. However, it should be understood that other or additional uses of the PLD 100 are contemplated and are within the scope of the description and claims.

The PLD editor 120 may include an interface 121, a processing system 122, and a storage system 123. It should be understood that the PLD editor 120 may further include additional components, circuits, or sub-systems (omitted for purposes of clarity).

The interface 121 of the PLD editor 120 may be coupled to the interface 101 of the PLD 100 for transferring the PLD code 130 to the PLD 100. The interface 121 of the PLD editor 120 may be coupled to the interface 101 of the PLD 100 for programming the PLD 100. During programming, a PLD code 130 may be downloaded from the PLD editor 120 to the PLD 100 and installed into the storage system 103 of the PLD 100.

The programming routine 125 is configured to transfer the PLD code 130 to the PLD 100, including programming the PLD code 130 into the PLD 100. The programming routine 125 therefore may include appropriate erase and programming cycle times, programming checks, programming verifications, and programming sub-routines.

Even small differences in the intended use of the PLD 100 may require the PLD code 100 to need editing, where the PLD code 130 is intended to be used in a different PLD device and/or used in a different end application. Further, while the fundamental concepts of PLD programming are common to all manufacturers, even small differences in I/O addressing, memory organization, and instruction sets mean that PLD programs are never perfectly interchangeable between different makers or even between different models.

The editing routine 127 of the PLD editor 120 may be configured to determine inconsistent logic instruction blocks in the PLD code 100 that are inconsistent with the PLD 100, indicate the inconsistent logic instruction blocks to a user of the PLD editor 120, and correct the inconsistent logic instruction blocks.

Alternatively, the PLD editor 120 may include a library of PLD code sets 146 that stores one or more existing PLD code sets. A user of the PLD editor 120 may select the PLD code 130 from the library of PLD code sets 146 and edit the PLD code 130 to re-use the PLD code 130 for a new application. Consequently, the editing routine 127 may be configured to retrieve the PLD code 130 from the library of PLD code sets 146, determine inconsistent logic instruction blocks in the PLD code 130 that are inconsistent with the PLD 100, indicate the inconsistent logic instruction blocks to a user of the PLD editor 120, and correct the inconsistent logic instruction blocks.

The library of PLD code sets 146 may be stored in the PLD editor 120, as shown. Alternatively, some or all of the library of PLD code sets 146 may be externally stored and accessed by the PLD editor 120 via the interface 121 and a suitable communication link (not shown). The communication link may comprise a suitable wired or wireless link. The communication link may be different from or the same as the communication link 108 used for programming the PLD 100.

FIG. 2 shows an exemplary PLD code 130. The PLD code 130 may include an operational routine 131 that is executed by the processing system 102 of the PLD 100. In a motor control application, the operational routine 131 may configure the PLD 100 as a motor controller and may execute various instructions that perform motor control operations.

The PLD code 130 may include one or more instruction blocks 133. The one or more instruction blocks 133 comprise logic instructions to be executed by the processing system 102 when executing the operational routine 131. In the motor controller example, an instruction block 133 may comprise a timer block that controls a timing aspect of motor control, such as a drive signal pulse width, a drive signal duty cycle, and drive signal on and off times, among other things.

The PLD code 130 may include block parameters 134 for each instruction block 133. The block parameters 134 may comprise values or other information required by the corresponding instruction block 133. In the motor controller example, an instruction block 133 comprising a timer block may require parameters including a start time and a stop time, for example. Each instruction block 133 may require a specific number of block parameters 134, depending on factors such as the characteristics, requirements, or design of the PLD 100, the end use/application, and the particular instruction block 133 (i.e., different timer blocks may require differing numbers of parameters). Other or additional factors are contemplated and are within the scope of the description and claims.

Figure 3:
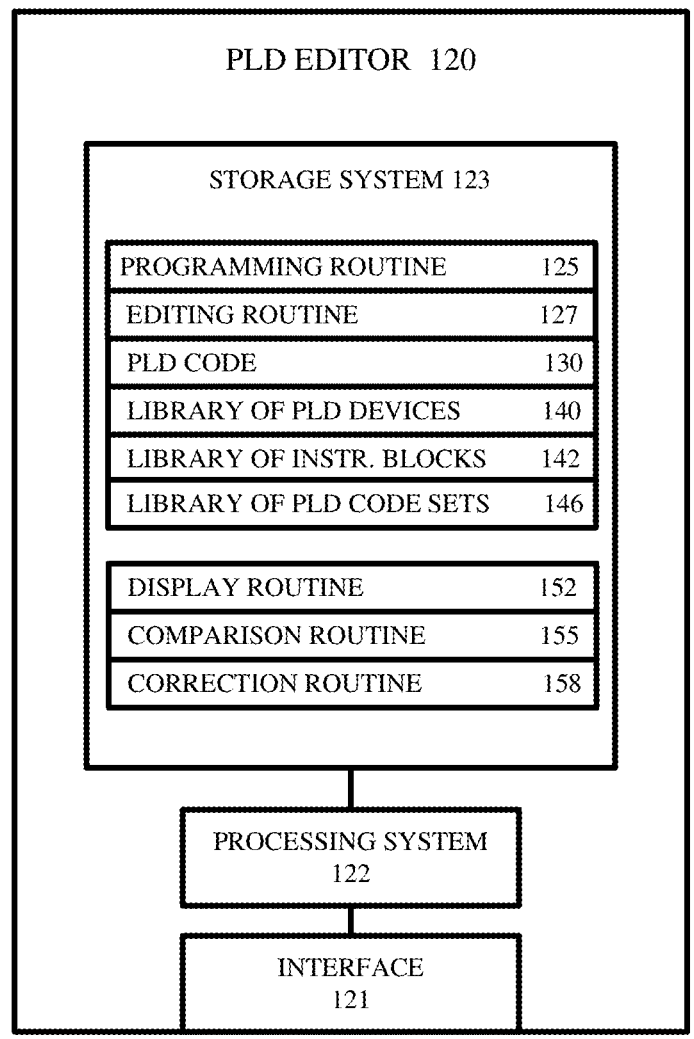
FIG. 3 shows detail of an exemplary PLD editor.

FIG. 3 shows detail of an exemplary PLD editor 120. In this example, the storage system 123 of the PLD editor 120 stores the programming routine 125, the editing routine 127, the PLD code 130, and the library of PLD code sets 146, as previously discussed. The storage system 123 may additionally store a library of PLD devices 140, a library of logic instruction blocks 142, a display routine 152, a comparison routine 155, and a correction routine 158.

The library of PLD devices 140 comprises a library of PLD devices and associated information that may be needed for programming. The library of PLD devices 140 may comprise known PLD devices. The library of PLD devices 140 may comprise commonly or previously used PLD devices. The library of PLD devices 140 may comprise PLD devices that are anticipated to be used at some point in time. The library of PLD devices 140 may comprise PLD devices wherein code for the PLD devices has already been created and/or edited.

The library of PLD devices 140 may include PLD information for one or more PLD models, for example. The library of PLD devices 140 may include PLD information for one or more PLD manufacturers, for example. However, other PLD information is contemplated and is within the scope of the description and claims.

The library of PLD devices 140 may be stored in the PLD editor 120, as shown. Alternatively, some or all of the library of PLD devices 140 may be externally stored and accessed by the PLD editor 120 via the interface 121 and a communication link.

The library of logic instruction blocks 142 comprises a library of at least a portion of possible logic instruction blocks 133 that can be used in applicable PLD devices. The library of logic instruction blocks 142 may store a variety of logic instruction blocks that perform specific functions. Further, the library of logic instruction blocks 142 may store a variety of logic instruction blocks that use differing parameters, such as families of logic instruction blocks that perform a similar function but may use different parameters and/or differing numbers of parameters. In the motor controller example, the library of logic instruction blocks 142 may store a variety of timer blocks, wherein a particular timer block may be selected according to the characteristics of the particular time block and the intended timer operation.

The library of logic instruction blocks 142 may be stored in the PLD editor 120, as shown. Alternatively, some or all of the library of logic instruction blocks 142 may be externally stored and accessed by the PLD editor 120 via the interface 121 and a communication link.

The display routine 152 comprises a routine configured to display the logic instruction blocks 133 of the PLD code 130 during an editing procedure. The logic instruction blocks 133 may be displayed by the display routine 152 in order to show the user which logic instruction blocks 133 are included in the PLD code 130. The logic instruction blocks 133 may be displayed by the display routine 152 in order to show the logic instruction blocks 133 that are proper for the PLD 100 and that are properly configured. The logic instruction blocks 133 may be displayed by the display routine 152 in order to show inconsistent logic instruction blocks, i.e., the logic instruction blocks 133 that are improper for the PLD 100, are improperly configured, or both.

The display routine 152 may visually indicate any inconsistent logic instruction blocks. The display routine 152 may display inconsistent logic instruction blocks in a different color. The display routine 152 may display inconsistent logic instruction blocks in ghosted or dashed lines. The display routine 152 may display inconsistent logic instruction blocks using different lines, different colors, different color intensities, or different gray scale values. The display routine 152 may display inconsistent logic instruction blocks by varying an aspect or aspects of the inconsistent logic instruction blocks. However, it should be understood that the display routine 152 may indicate inconsistent logic instruction blocks in any suitable fashion.

The comparison routine 155 comprises a routine configured to compare one or more logic instruction blocks 133 and determine whether the one or more logic instruction blocks 133 are proper for the PLD 100. The comparison may comprise a comparison of the one or more logic instruction blocks 133 to a subset of the library of instruction blocks 142 according to the PLD device information in the library of PLD devices 140. By indexing into the library of instruction blocks 142 using the target PLD 100, a set of proper logic instruction blocks can be compared to the one or more logic instruction blocks 133.

The correction routine 158 comprises a routine configured to correct an identified inconsistent logic instruction block. The correction routine 158 may auto-correct the identified inconsistent logic instruction block. The correction routine 158 may present a request for specific information from the user, such as an indication that the user should fill in a missing block parameter or parameters 134. The correction routine 158 may indicate information that is not needed in a logic instruction block 133 (i.e., one or more unneeded block parameters 134). The correction routine 158 may indicate information that has been automatically deleted from a logic instruction block 133.

When the processing system 122 executes the editing routine 127 in one example, the editing routine 127 may configure the processing system 122 to obtain the PLD code 130, with the PLD code 130 comprising one or more logic instruction blocks 133 and corresponding block parameters 134 for each logic instruction block of the one or more logic instruction blocks 133, with the PLD code 130 being intended for programming into the PLD 100 (i.e., the user may select a PLD code that is already highly suited for the intended PLD 100), compare the one or more logic instruction blocks 133 of the PLD code 130 to a subset of the library of logic instruction blocks 142 according to the library of PLD devices 140, determine inconsistent logic instruction blocks of the one or more logic instruction blocks 133, indicate the inconsistent logic instruction blocks to a user of the PLD editor 120, and correct the inconsistent logic instruction blocks using the subset of the library of logic instruction blocks 142.

When the processing system 122 executes the editing routine 127 in another example, the editing routine 127 may configure the processing system 122 to obtain the PLD code 130, with the PLD code 130 comprising one or more logic instruction blocks 133 and corresponding block parameters 134 for each logic instruction block of the one or more logic instruction blocks 133, with the PLD code 130 being intended for programming into the PLD 100, compare the one or more logic instruction blocks 133 of the PLD code 130 to a subset of the library of logic instruction blocks 142 according to the library of PLD devices 140, determine inconsistent logic instruction blocks of the one or more logic instruction blocks 133, indicate the inconsistent logic instruction blocks to a user of the PLD editor 120, wherein the inconsistent logic instruction blocks may include inconsistent logic instruction blocks 133 or inconsistent block parameters 134, and correct the inconsistent logic instruction blocks using the subset of the library of logic instruction blocks 142, wherein inconsistent logic instruction blocks 133 and inconsistent block parameters 134 are corrected.

Figure 4:
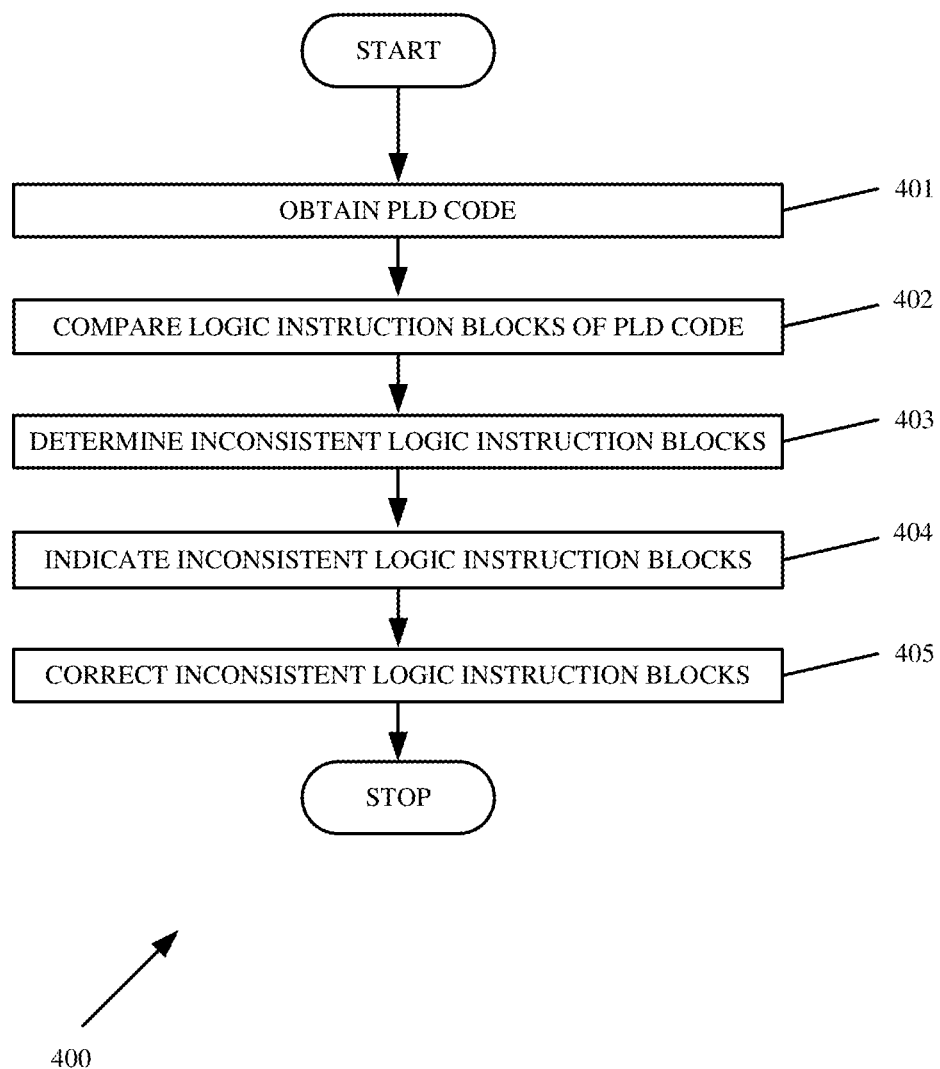
FIG. 4 is a flowchart of a PLD editing method for editing a PLD code to be programmed into a PLD.

FIG. 4 is a flowchart 400 of a PLD editing method for editing a PLD code 130 to be programmed into a PLD 100. In step 401, the PLD code 130 is obtained. The user may select or specify the PLD code 130. The PLD code 130 may be a pre-existing PLD code 130, for example. The PLD code 130 may be obtained from a library of PLD code sets 146 stored in the PLD editor 120. Alternatively, the PLD code 130 may be obtained from other sources external to the PLD editor 120.

The PLD code 130 may be modified by a user of the PLD editor in order to program the PLD code 130 into a target PLD 100. Modifying the PLD code 130 may be more time-efficient than creating a new PLD code from scratch. Further, modifying the PLD code 130 may result in a lower risk of programming errors in the resulting code, especially where the target PLD 100 is minimally different from a PLD device where the PLD code 130 was previously used.

In step 402, logic instruction blocks 133 of the PLD code 130 are compared to the library of logic instruction blocks 142. The comparison may comprise a comparison of the one or more logic instruction blocks 133 to a subset of the library of instruction blocks 142 according to the PLD device information in the library of PLD devices 140. By indexing into the library of instruction blocks 142 using the target PLD 100, the one or more logic instruction blocks 133 can be compared to a set of proper logic instruction blocks.

In step 403, inconsistent logic instruction blocks of the one or more logic instruction blocks 133 are determined as a result of the comparison.

In step 404, the inconsistent logic instruction blocks are indicated. The indication may comprise an indication to the user of the PLD editor 120. The indication may comprise a visual indication to the user of the PLD editor 120. The inconsistent logic instruction blocks may be visually indicated in ghosted or dashed lines. The inconsistent logic instruction blocks may be visually indicated using different lines, different colors, different color intensities, or different gray scale values. The inconsistent logic instruction blocks may be visually indicated by varying an aspect or aspects of the inconsistent logic instruction blocks. However, it should be understood that the inconsistent logic instruction blocks may be indicated in any suitable fashion.

In step 405, the inconsistent logic instruction blocks are corrected. The inconsistent logic instruction blocks are corrected so that the PLD code 130 can be programmed into the PLD 100. The inconsistent logic instruction blocks are corrected so that the PLD code 130, when programmed into the PLD 100, will properly and efficiently operate the PLD 100 when executed by the PLD 100.

The correction may include removing unneeded or improper logic instruction blocks 133. The correction may include modifying improper logic instruction blocks 133. The correction may include supplying proper logic instruction blocks 133 for the PLD 100.

Figure 5:
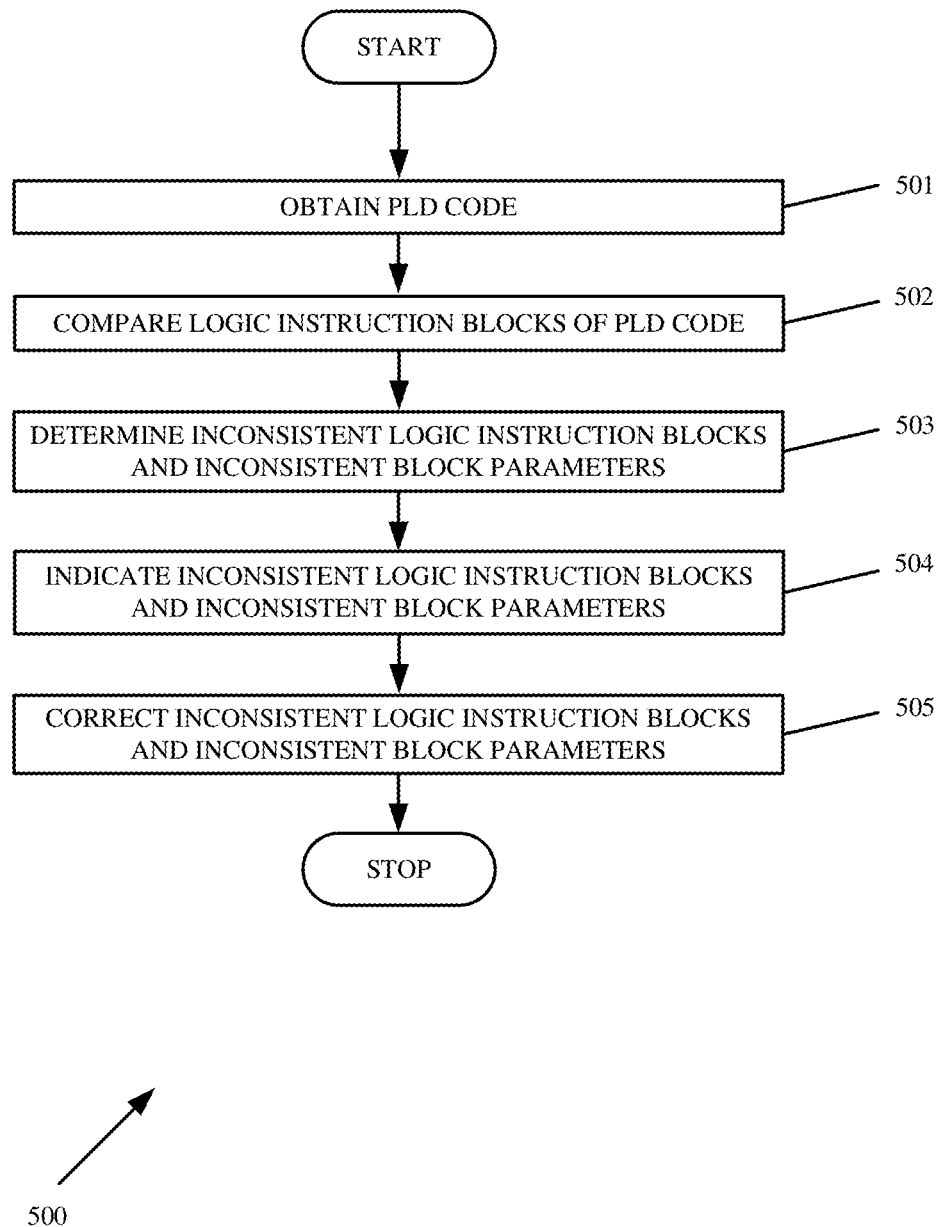
FIG. 5 is a flowchart of a PLD editing method for editing a PLD code to be programmed into a PLD.

FIG. 5 is a flowchart 500 of a PLD editing method for editing a PLD code 130 to be programmed into a PLD 100. In step 501, the PLD code 130 is obtained, as previously discussed.

In step 502, logic instruction blocks 133 of the PLD code 130 are compared to the library of logic instruction blocks 142, as previously discussed.

In step 503, inconsistent logic instruction blocks 133 of the one or more logic instruction blocks 133 and inconsistent block parameters 134 are determined as a result of the comparison, as previously discussed.

In step 504, the inconsistent logic instruction blocks 133 and the inconsistent block parameters 134 are indicated. The indication may comprise an indication to the user of the PLD editor 120, as previously discussed. The indication may comprise a visual indication to the user of the PLD editor 120, as previously discussed.

In step 505, the inconsistent logic instruction blocks 133 and the inconsistent block parameters 134 are corrected. The inconsistent logic instruction blocks 133 and the inconsistent block parameters 134 are corrected so that the PLD code 130 can be programmed into the PLD 100. The inconsistent logic instruction blocks 133 and the inconsistent block parameters 134 are corrected so that the PLD code 130, when programmed into the PLD 100, will properly and efficiently operate the PLD 100 when executed by the PLD 100.

The correction may include removing unneeded or improper logic instruction blocks 133. The correction may include removing unneeded or improper block parameters 134 of logic instruction blocks 133.

The correction may include modifying improper logic instruction blocks 133. The correction may include modifying improper block parameters 134 of logic instruction blocks 133.

The correction may include supplying proper logic instruction blocks 133 for the PLD 100. The correction may include supplying proper block parameters 134 for logic instruction blocks 133.

Figure 6A:
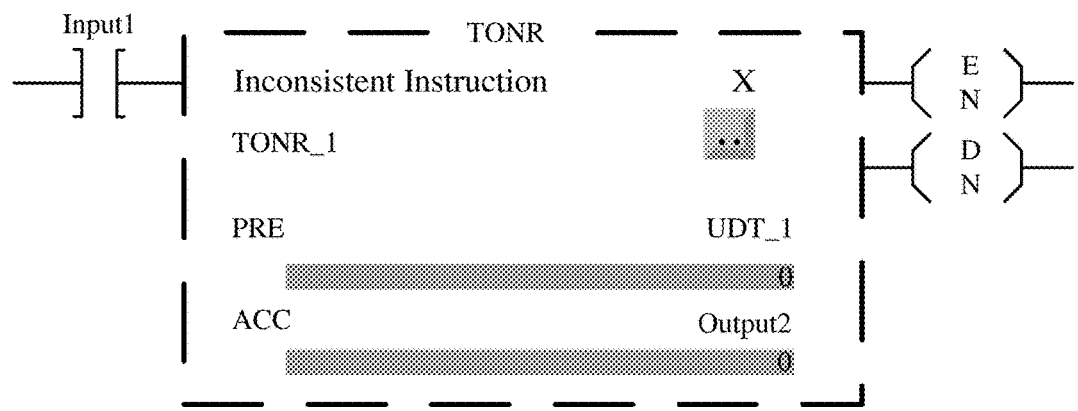
FIGS. 6A-6B show an example graphic display generated by the PLD editor to a user of the PLD editor.

FIG. 6A shows an example graphic display generated by the PLD editor 120 to a user of the PLD editor 120. The display comprises an example display of a Timer On Delay with Reset (TONR) block, wherein the TONR block is visually/graphically indicated to be improper. In the example shown, the improper status of the TONR block is visually indicated by the TONR instruction block comprising a dashed line. It should be understood that the dashed box could be fixed in nature, could be generated in a different color from a proper instruction block, or could be moved, flashed, or otherwise animated or varied in appearance over a period of time.

In addition, the display of the improper instruction block can be accompanied by display text. The display text can further indicate that the instruction block is improper. The displayed text can further call out how the instruction block is improper. For example, in the TONR block shown in the figure, the displayed block could be accompanied by text stating that the Input PRE and all of its bindings are unsupported in the TONR block. The text can inform the user that the TONR block cannot be used as it is.

Further, the display of the improper instruction block can be accompanied by a graphical input icon or icons that can be selected by the user. For example, the graphical input icon could comprise a selection of proper values or configurations that can be used as a replacement for an improper value or configuration. For example, the graphical input selection could comprise an "auto-correct" feature, wherein when the auto-correct graphical input selection is selected by the user, the PLD editor 120 makes an automatic correction to the improper instruction block, wherein the user must select the auto-correct feature but does not have to perform the correction or know how to correct the improper instruction block.

Figure 6B:
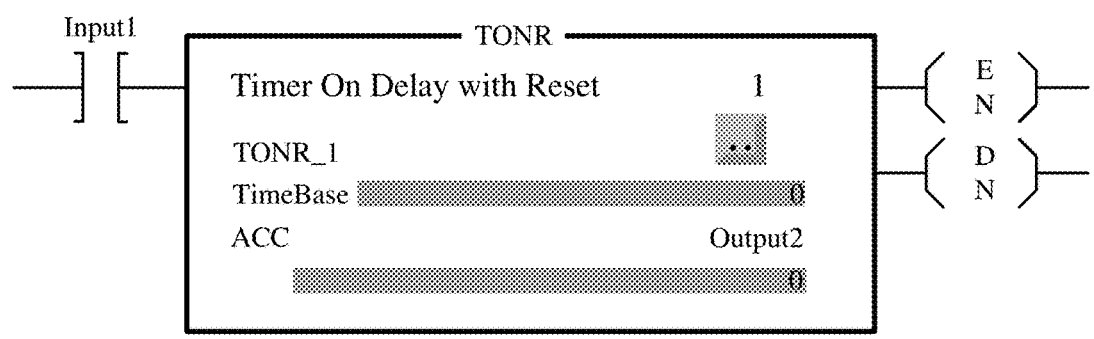

FIG. 6B shows the graphic display generated by the PLD editor 120 after the improper instruction block of FIG. 6A has been corrected. The instruction block is now shown with a solid line, indicating that the instruction block is properly configured and is properly used in the instruction set. Further, the instruction block shows that the "PRE" instruction block parameter section has been changed.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A computing system for editing programmable logic device (PLD) code to be programmed into a PLD, the computing system comprising:
   an interface for communicating with the PLD;
   a storage system for storing the PLD code, a library of PLD devices, and a library of logic instruction blocks; and
   a processing system coupled to the interface and the storage system, with the processing system configured to obtain the PLD code, with the PLD code comprising one or more logic instruction blocks and corresponding block parameters for each logic instruction block of the one or more logic instruction blocks, compare the one or more logic instruction blocks of the PLD code to a subset of the library of logic instruction blocks applicable to the PLD to identify inconsistent logic instruction blocks of the one or more logic instruction blocks, and correct the inconsistent logic instruction blocks using the subset of the library of logic instruction blocks.

2. The computing system of claim 1, with indicating the inconsistent logic instruction blocks further comprising visually indicating the inconsistent logic instruction blocks.

3. The computing system of claim 1, with correcting the inconsistent logic instruction blocks comprising correcting the inconsistent logic instruction blocks without the user initiating corrections or inputting corrections.

4. The computing system of claim 1 wherein to correct the inconsistent logic instruction blocks, the processing system:
   accesses a library of instruction blocks and indicating any inconsistent logic instruction blocks to the user;
   retrieves and displays alternative logic instruction blocks to the user; and
   receives user instruction selections and implementing the selected logic instruction blocks in the inconsistent logic instruction blocks.

5. The computing system of claim 1, wherein to correct the inconsistent logic instruction blocks, the processing system:
   accesses a library of instruction blocks and indicating any inconsistent block parameters to the user; and
   receives user parameter selections and implementing the selected block parameters in the inconsistent logic instruction blocks.

6. The computing system of claim 1, wherein to correct the inconsistent logic instruction blocks the processing system:
   accesses a library of instruction blocks and indicating any inconsistent block parameters to the user;
   indicates a parameter range for the selected block parameters to the user; and
   receives user parameter selections and implementing the selected block parameters in the inconsistent logic instruction blocks.

7. The computing system of claim 1, with the PLD code being obtained from a library of PLD code sets.

8. A method for editing Programmable Logic Device (PLD) code to be programmed into a PLD, the method comprising:
   in a computing system, obtaining the PLD code, with the PLD code comprising one or more logic instruction blocks and corresponding block parameters for each logic instruction block of the one or more logic instruction blocks, with the PLD code being intended for programming into the PLD;
   in the computing system, comparing the one or more logic instruction blocks of the PLD code to a subset of the library of logic instruction blocks applicable to the PLD according to the library of PLD devices;
   in the computing system, determining inconsistent logic instruction blocks of the one or more logic instruction blocks;
   in the computing system, correcting the inconsistent logic instruction blocks using the subset of the library of logic instruction blocks.

9. The method of claim 8, further comprising indicating the inconsistent logic instruction blocks, including visually indicating the inconsistent logic instruction blocks.

10. The method of claim 8, with correcting the inconsistent logic instruction blocks comprising correcting the inconsistent logic instruction blocks without the user initiating corrections or inputting corrections.

11. The method of claim 8, with correcting the inconsistent logic instruction blocks comprising:
   in the computing system, accessing a library of instruction blocks and indicating any inconsistent logic instruction blocks to the user;
   in the computing system, retrieving and displaying alternative logic instruction blocks to the user; and
   in the computing system, receiving user instruction selections and implementing the selected logic instruction blocks in the inconsistent logic instruction blocks.

12. The method of claim 8, with correcting the inconsistent logic instruction blocks comprising:
   in the computing system, accessing a library of instruction blocks and indicating any inconsistent block parameters to the user; and
   in the computing system, receiving user parameter selections and implementing the selected block parameters in the inconsistent logic instruction blocks.

13. The method of claim 8, with correcting the inconsistent logic instruction blocks comprising:
   in the computing system, accessing a library of instruction blocks and indicating any inconsistent block parameters to the user;
   in the computing system, indicating a parameter range for the selected block parameters to the user; and
   in the computing system, receiving user parameter selections and implementing the selected block parameters in the inconsistent logic instruction blocks.

14. The method of claim 8, with the PLD code being obtained from a library of PLD code sets.

15. A computing apparatus comprising:
   one or more computer readable storage devices;
   program instructions stored on the one or more computer readable storage devices for editing Programmable Logic Device (PLD) code to be programmed into a PLD, wherein the program instructions, when executed by a processing system, direct the processing system to at least:
   obtain the PLD code, with the PLD code comprising one or more logic instruction blocks and corresponding block parameters for each logic instruction block of the one or more logic instruction blocks, with the PLD code being intended for programming into the PLD;
   compare the one or more logic instruction blocks of the PLD code to a subset of the library of logic instruction blocks applicable to the PLD according to the library of PLD devices;
   identify inconsistent logic instruction blocks of the one or more logic instruction blocks and inconsistent block parameters;
   indicate the inconsistent logic instruction blocks to a user of the PLD editor, wherein the inconsistent logic instruction blocks may include one or both of inconsistent logic instruction blocks or inconsistent block parameters; and
   correct the inconsistent logic instruction blocks using the subset of the library of logic instruction blocks, wherein inconsistent logic instruction blocks and inconsistent block parameters are corrected.

16. The computing apparatus of claim 15, wherein to indicate the inconsistent logic instruction blocks the processing system visually indicates the inconsistent logic instruction blocks.

17. The computing apparatus of claim 15, wherein to correct the inconsistent logic instruction blocks, the processing system corrects the inconsistent logic instruction blocks without the user initiating corrections or inputting corrections.

18. The computing apparatus of claim 15, wherein to correct the inconsistent logic instruction blocks, the processing system:
   retrieves and displaying alternative logic instruction blocks to the user; and
   receives user instruction selections and implementing the selected logic instruction blocks in the inconsistent logic instruction blocks.

19. The computing apparatus of claim 15, wherein to correct the inconsistent logic instruction blocks, the processing system receives user parameter selections and implements the selected block parameters in the inconsistent logic instruction blocks.

20. The computing apparatus of claim 15, wherein to correct the inconsistent logic instruction blocks, the processing system indicates a parameter range for the selected block parameters to the user, receives user parameter selections, and implements the selected block parameters in the inconsistent logic instruction blocks.

* * * * *